United States Patent [19]
Stecker

[11] Patent Number: 5,870,345
[45] Date of Patent: Feb. 9, 1999

[54] TEMPERATURE INDEPENDENT OSCILLATOR

[75] Inventor: Johannes Stecker, Munich, Germany

[73] Assignee: Siemens Aktiengesellschaft, Munich, Germany

[21] Appl. No.: 923,300

[22] Filed: Sep. 4, 1997

[51] Int. Cl.[6] .................................................. G11C 8/00
[52] U.S. Cl. .......................... 365/222; 331/111; 331/143; 331/176
[58] Field of Search .................... 365/222; 331/111, 331/143, 176

[56] References Cited

U.S. PATENT DOCUMENTS

| | | | |
|---|---|---|---|
| 4,714,901 | 12/1987 | Jain et al. ................................. | 331/176 |
| 4,785,262 | 11/1988 | Ryu et al. ................................ | 331/111 |
| 4,868,525 | 9/1989 | Dias ........................................ | 331/111 |
| 5,180,995 | 1/1993 | Hayashi et al. ......................... | 331/176 |
| 5,262,998 | 11/1993 | Mnich et al. ........................... | 365/222 |
| 5,448,103 | 9/1995 | deWit ..................................... | 257/536 |
| 5,455,801 | 10/1995 | Blodgett et al. ........................ | 365/222 |
| 5,461,590 | 10/1995 | Cordoba et al. ........................ | 365/222 |
| 5,596,545 | 1/1997 | Lin ......................................... | 365/236 |
| 5,604,467 | 2/1997 | Matthews ................................ | 331/176 |
| 5,646,579 | 7/1997 | Blodgett ................................. | 365/222 |
| 5,694,090 | 12/1997 | Morgan .................................. | 331/111 |

*Primary Examiner*—David Nelms
*Assistant Examiner*—Tuan T. Nguyen
*Attorney, Agent, or Firm*—Stanton C. Braden

[57] ABSTRACT

An improved oscillator circuit 400 having a frequency that is substantially independent of temperature. The improved oscillator circuit is particularly well suited for use in an integrated circuit device to produce a clock signal, such as a refresh clock for a dynamic random access memory (DRAM) integrated circuit. The current $i_c$ produced is temperature independent so that the refresh frequency for the DRAM integrated circuit is stable over temperature.

23 Claims, 5 Drawing Sheets

TEMPERATURE INDEPENDENT OSCILLATOR

BACKGROUND OF THE INVENTION

1. Field of the Invention

The present invention relates to oscillators, and more particularly, to oscillators for integrated circuit devices or chips.

2. Description of the Related Art

Oscillators or clocks are often used for a variety of reasons in integrated circuits and computers. For example, in the case of dynamic random access memory (DRAM) integrated circuits, low frequency oscillators are often required in order to generate a refresh clock signal. A DRAM integrated circuit uses the refresh clock signal to refresh its stored data when in a self-refresh mode. Specifically, the refresh clock signal operates to signal the DRAM integrated circuit when the stored data in the DRAM integrated circuit should be refreshed in order to preserve its state.

Generally speaking, low frequency oscillators have conventionally operated by charging a large capacitance value using a small current, then evaluating the voltage level at the large capacitance. When the voltage is determined to exceed a certain level, the state of an output changes which is used to generate a pulse. Conventionally, there are two different and distinct ways to produce the small current that is used to charge the large capacitance. One approach is to provide a large resistor between the capacitance and a supply voltage, and thus produce a small current through the resistor to charge the large capacitance. Another approach is to provide a constant current source to supply a small current to the large capacitance. Each of these approaches is described in additional detail with respect to FIGS. 1 and 2, respectively.

Figure 1:
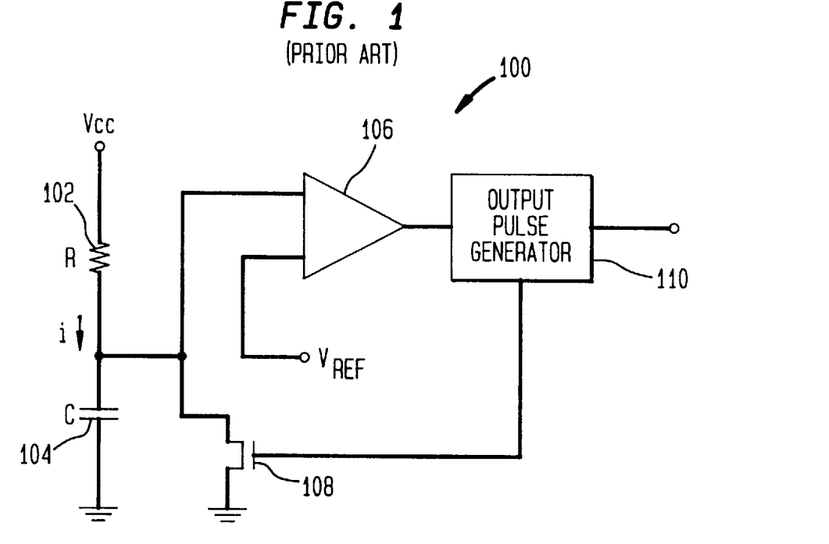
FIG. 1 is a schematic diagram of a first conventional oscillator.

FIG. 1 is a schematic diagram of a first conventional oscillator 100. The first conventional oscillator 100 includes a resistor (R) 102, a capacitor (C) 104, a differential amplifier 106, a reset transistor 108, and an output pulse generator 110. The resistor (R) 102 and the capacitor (C) 104 are connected in series between a supply voltage ($V_{cc}$) and ground. A current (i) is produced and flows from the supply voltage ($V_{cc}$) to the capacitor (C) 104. The differential amplifier 106 has a first input terminal connected to a node connecting the resistor (R) 102 and the capacitor (C) 104, and a second input terminal connected to a reference voltage ($V_{REF}$). The differential amplifier 106 also has an output terminal connected to the output pulse generator 110. The output pulse generator 110 outputs a pulse is generated by the first conventional oscillator 100. The output pulse generator 110 also supplies a reset signal to a gate of the reset transistor 108 to control a discharge operation on the capacitor (C) 104. The combined effect of the charging and the discharging of the capacitor (C) 104 is the production of the periodic pulses (i.e., oscillator or clock) by the output pulse generator 110. One problem with the first conventional oscillator 100 is that the current (i) produced by the resistor (R) 102 decreases as temperature increases because the resistance of the resistor (R) 102 increases with temperature. As a result, the frequency of the periodic pulses undesirably varies with temperature. Another problem with the first conventional oscillator 100 is that the current (i) varies with the supply voltage ($V_{cc}$).

Figure 2:
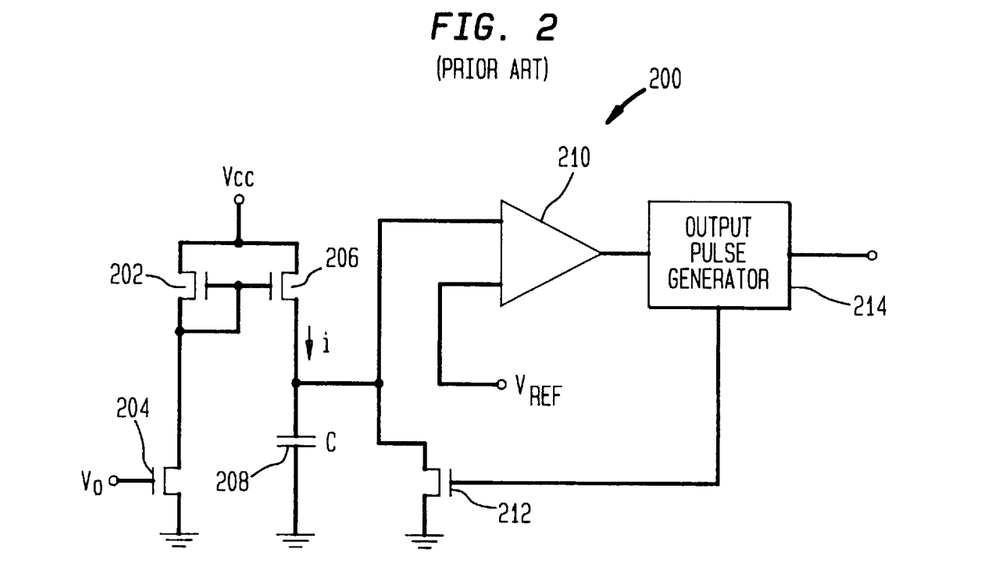
FIG. 2 is a schematic diagram of a second conventional oscillator.

FIG. 2 is a schematic diagram of a second conventional oscillator 200. The second conventional oscillator 200 includes transistors 202, 204 and 206, a capacitor (C) 208, a differential amplifier 210, a reset transistor 212, and an output pulse generator 214. The transistors 202 and 206 are p-type transistors, and the transistor 204 is a n-type transistor. The transistors 202, 204 and 206 produce a current (i) that is used to charge the capacitor (C) 208. The transistors 202 and 206 are coupled to a supply potential ($V_{cc}$) and form a current mirror arrangement. The current mirror arrangement produces a current (i) that is supplied the capacitor (C) 208. The transistor 204 is activated by a control voltage ($V_o$) so as to limit the current (i) produced by the current mirror arrangement. The differential amplifier 210 includes a first input terminal connected to the capacitor (C) 208, and a second input terminal connected to a reference voltage ($V_{REF}$). The differential amplifier 210 also includes an output terminal for supplying a signal to the output pulse generator 214. The output pulse generator 214 outputs a pulse is generated by the second conventional oscillator 200. The output pulse generator 214 also supplies a reset signal to a gate of the reset transistor 212. When activated, the reset transistor 212 operates to discharge the capacitor (C) 208. The repeated charging and discharging of the capacitor (C) 104 causes the second conventional oscillator 200 to produce periodic pulses (i.e., oscillator or clock). Unlike the first conventional oscillator 100, the second conventional oscillator 200 produces a current (i) that is independent of the supply voltage ($V_{cc}$) level. However, one problem with the second conventional oscillator 200 is that the current (i) produced by the current mirror arrangement varies with temperature. As a result, the frequency of the periodic pulses also undesirably varies with temperature.

In general, it is desirable to produce oscillators or clocks that are independent of temperature variations. In the case of a DRAM integrated circuit, the oscillator or clock circuit provided to produce a refresh clock must be sufficiently constant so that the memory cells of the DRAM integrated circuit are refreshed in a timely manner in accordance with design specifications. Hence, it is desirable that the refresh clock have a constant frequency regardless of temperature variations. If the frequency of the refresh clock is faster than necessary, extra energy or power is wasted in refreshing the DRAM integrated circuit too frequently. On the other hand, if the frequency of the refresh clock is too slow, the DRAM integrated circuit can fail and thus lose its stored data. Hence, the conventional oscillator designs produce clocks with frequencies that vary over time and thus tend either waste energy or lose stored data when temperature variations are incurred.

Thus, there is a need for improved oscillator designs that produce oscillators or clocks that are not effected by temperature variations.

SUMMARY OF THE INVENTION

Broadly speaking, the invention is an improved oscillator circuit having a frequency that is substantially independent of temperature. The improved oscillator circuit is particularly well suited for use in an integrated circuit device for producing a clock signal, such as a refresh clock for a dynamic random access memory (DRAM) integrated circuit.

The invention can be implemented in numerous ways, including as an apparatus, a circuit, and a method. Several embodiments of the invention are discussed below.

As an oscillator for an integrated circuit device, an embodiment of the invention includes: a temperature independent current source for supplying a current, the current being independent of temperature over a normal operating range of the integrated circuit device; a charge accumulation device coupled to the temperature independent current source, the charge accumulation device operates to accumulate charge from the current supplied by the temperature independent current source, and to output a voltage in accordance with the amount of the accumulated charge; a pulse generation circuit coupled to the charge accumulation device, the pulse generation circuit outputs a clock pulse after the voltage output from the charge accumulation device exceeds a predetermined threshold; and a reset circuit coupled to the pulse generation circuit, the reset circuit operates to reset the charge accumulation device so that charge thereafter begins to accumulate for a next clock pulse. Optionally, the temperature independent current source may include: a first current source for supplying a first current that increases as temperature increases; a second current source for supplying a second current that decreases as temperature increases; and a combiner for combining the first current and the second current to produce the current being supplied by the temperature independent current source such that the current is independent of temperature over the normal operating range of the integrated circuit device.

As a low frequency oscillator, an embodiment of the invention includes: a first FET transistor having gate, drain and source terminals, the source terminal is connected to a first supply potential, and the gate terminal and the drain terminal are commonly connected; a second FET transistor having gate, drain and source terminals, the source terminal is connected to the first supply potential, and the gate terminal is connected to the gate terminal of the first FET transistor; a third FET transistor having gate, drain and source terminals, the drain terminal is connected to the drain terminal of the first FET transistor, the source terminal is connected to a second supply potential, and the gate terminal received a third supply potential, the third supply potential have a voltage between that of the first and second supply potentials; a capacitive load coupled between the drain terminal of the second FET transistor and the second supply potential, the capacitive load coupling to the drain terminal of the FET transistor at a node; a resistive device for providing a resistance, the resistive device having a first side coupled to the first supply potential and having a second side coupled to the capacitive load at the node; a fourth FET transistor having gate, drain and source terminals, the drain terminal is connected to the node, the source terminal is connected to the second supply potential, and the gate terminal receives a reset signal; and a differential amplifier having a first input terminal, a second input terminal and an output terminal, the first input terminal is connected to the node, the second input terminal is connected to a reference voltage, and the output terminal produces an output signal. Preferably, the first and second FET transistors are p-type FET transistors, and the third and fourth FET transistors are n-type FET transistors.

As a self-refreshing dynamic random access memory, an embodiment of the invention includes: an array of dynamic random access memory cells for storing data; and a self-refresh circuit operatively connected to the array. The self-refresh circuit operates to periodically refresh the data stored in the array, and includes at least a temperature independent frequency oscillator that produces a refresh clock having a substantially constant frequency despite temperature variations using first and second temperature dependent currents.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention is an improved oscillator circuit having a frequency that is substantially independent of temperature. The improved oscillator circuit is particularly well suited for use in an integrated circuit device to produce a clock signal, such as a refresh clock for a random access memory (RAM) integrated circuit including dynamic RAMs (DRAMs) and Synchronous DRAMs (SDRAMs). According to the invention, a current is produced in a temperature independent manner such that the refresh frequency for the DRAM integrated circuit is stable over temperature. As such, the invention insures that the refresh frequency in a refresh mode of operation for a DRAM integrated circuit meets the requirements of the retention time over the entire temperature range (e.g., 0_C.–85_C.) without wasting excessive energy.

Illustrative embodiments of the invention are discussed below with reference to FIGS. 3–8B. However, those skilled in the art will readily appreciate that the detailed description given herein with respect to these figures is for explanatory purposes as the invention extends beyond these limited embodiments.

Figure 3:
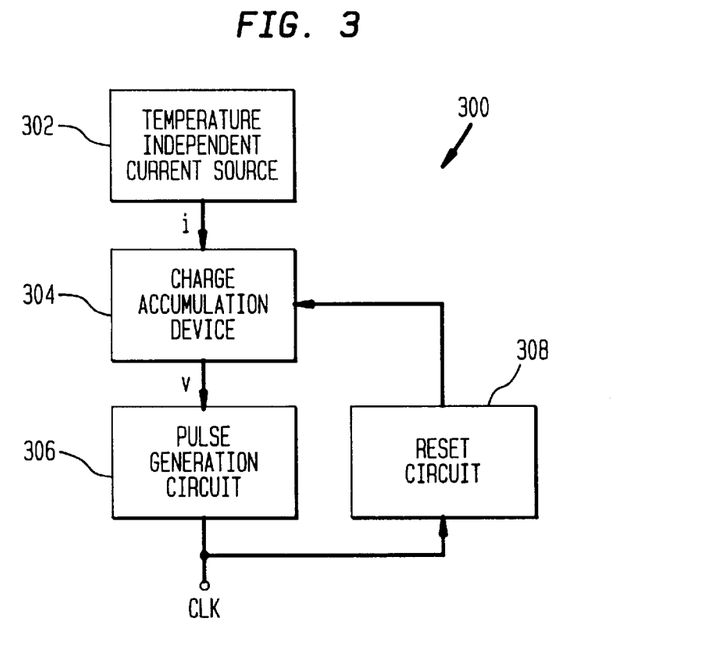
FIG. 3 is a basic block diagram of an oscillator circuit according to an embodiment of the invention.

FIG. 3 is a basic block diagram of an oscillator circuit 300 according to an embodiment of the invention. The oscillator circuit 300 includes a temperature independent current source 302 that produces a current (i). The current (i) produced by the temperature independent current source 302 is constant over temperature. In particular, the current (i) is substantially constant over an operating temperature of the circuitry involved (e.g., 0_C.–85_C.). The oscillator circuit 300 also includes a charge accumulation device 304. The charge accumulation device 304 receives the current (i) supplied by the temperature independent current source 302. The charge accumulation device 304 accumulates charges (i.e., electrical energy) being supplied by the current (i) and produces a voltage (V) based on the accumulated charge. A pulse generation circuit 306 is also provided in the oscillator circuit 300 to monitor the voltage (V) produced by the charge accumulation device 304. When the voltage (V)

produced by the charge accumulation device 304, which increases as charges are accumulated, exceeds a predetermined threshold amount, the pulse generation circuit 306 causes its output terminal to transition its logic level. For example, the pulse generation circuit 306 transitions from a low logic level to a high logic level. When the output of the pulse generation circuit 306 transitions, a reset circuit 308 of the oscillator circuit 300 detects the transition and outputs a reset signal to the charge accumulation device 304. The reset signal causes the charge accumulation device 304 to discharge any charges that have been accumulated. Effectively, the voltage of the charge accumulation device 304 then rapidly approaches zero volts. As such, the pulse generating circuit 306 which is monitoring the voltage of the charge accumulation device 304 causes the output of the pulse generation circuit 306 to transition back to its original state. For example, the output of the pulse generation circuit 306 would transition from a high logic level back to a low logic level. Accordingly, the oscillator circuit 300 produces a pulse at its output terminal. The output of the oscillator 300 can also be considered a clock signal or oscillator given that the oscillator circuit 300 operates to repeat this operation of producing pulses.

Figure 4:
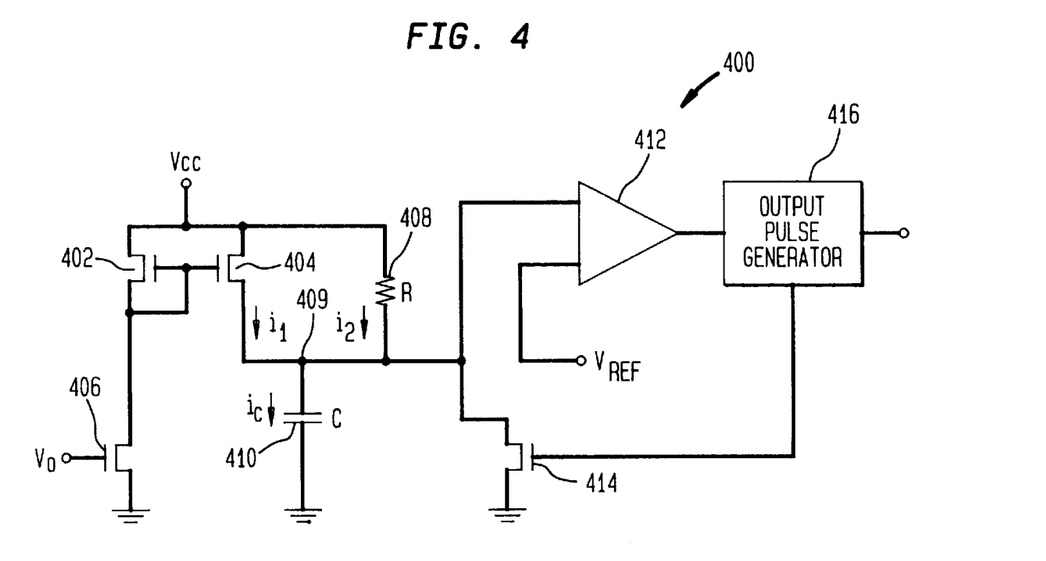
FIG. 4 is a schematic diagram of an oscillator circuit according to a first embodiment of the invention.

FIG. 4 is a schematic diagram of an oscillator circuit 400 according to one embodiment of the invention. The oscillator circuit 400 includes a first transistor 402 and a second transistor 404. The first and second transistors 402 and 404 are configured to form a current mirrored circuit. As shown, the source terminals of the first and second transistors 402 and 404 are coupled to a first supply voltage ($V_{cc}$), the gates of the first and second transistors 402 and 404 are commonly connected, and the commonly connected gates are connected to the drain of the first transistor 402. A third transistor 406 couples the drain terminal of the first transistor 402 to a second supply potential (ground). The third transistor 406 is controlled by a control voltage ($V_o$). The third transistor 406 operates to control the amount of current ($i_1$) output by the current mirror circuit. As an example, the first, second and third transistors 402, 404 and 406 can be metal-oxide-semiconductor (MOS) transistors or field-effect transistors (FETs).

The oscillator circuit 400 further includes a resistor (R) 408. The resistor (R) 408 is coupled between the first supply potential ($V_{cc}$) and a node 409 that couples to the output terminal of the current mirror circuit. A current ($i_2$) flows through the resistance (R) 408 into the node 409.

Additionally, the oscillator circuit 400 includes a capacitor (C) 410. The capacitor (C) 410 is connected between the node 409 and the second supply potential (ground). The current ($i_c$) flowing to the capacitor (C) 410 from the node 409 to the second supply potential (ground) is the sum of the current ($i_1$) and the current ($i_2$).

The oscillator circuit 400 also includes a differential amplifier 412, a reset transistor 414 and an output pulse generator 416. A first input terminal of the differential amplifier 412 couples to the node 409 so as to receive the voltage level appearing across the capacitor (C) 410. A second input terminal of the differential amplifier 412 is coupled to a reference voltage ($V_{REF}$). The differential amplifier 412 also has an output terminal coupled to the output pulse generator 416. When the voltage appearing at node 409 exceeds the reference voltage ($V_{REF}$), then the output of the differential amplifier 412 has a high logic level, and when the voltage level at the node 409 is less than the reference voltage ($V_{REF}$), the output of the differential amplifier 412 has a low logic level. Further, the output signal from the differential amplifier 412 is coupled to the output pulse generator 416 which outputs an output signal and a reset signal. The reset signal is supplied to the reset transistor 414 to discharge the capacitor (C) 410. That is, when the output signal from the differential amplifier 412 transitions to a high logic value, the output pulse generator 416 produces the reset signal which causes the reset transistor 414 to turned on to discharge the capacitor (C) 410 and thus reduce the voltage level at the node 409. When the voltage level at the node 409 is decreased substantially by the reset transistor 414, the output of the differential amplifier 412 will revert back to its previous state because the voltage level at the node 409 becomes less than the reference voltage ($V_{REF}$) and thus the differential amplifier 412 will transition to a low logic level. As a result, the output signal from the output pulse generator 416 contains periodic pulses. The output pulse generator 416 can set the pulse width of the periodic pulses to a suitable size.

The oscillator circuit 400 according to an embodiment of the invention produces a clock signal (i.e., periodic pulses) at a substantially constant frequency regardless of temperature variations. The temperature independence of the oscillator circuit 400 is provided by combining the current ($i_1$) and the current ($i_2$) to form the current ($i_c$). The current ($i_1$) has a temperature dependence such that as temperature increases the current ($i_1$) increases, and the current ($i_2$) has a temperature dependence such that as temperature increases the current ($i_1$) decreases. According to the invention, these inversely dependent currents are combined to form the current ($i_c$) such that it is substantially independent of temperature variations, at least within a normal operating range of the circuitry. Further, when the current ($i_c$) is substantially independent of temperature variations, the resulting clock signal produced is likewise substantially independent of temperature variations.

For example, with respect to the oscillator circuit 400, when the current ($i_1$) is set at approximately 1.4 $\mu$A and the current ($i_2$) is set at approximately 4 $\mu$A, then the resulting current ($i_c$) is substantially independent of temperature variations. Other exemplary design values for the oscillator circuit 400 include R=400 k$\Omega$, C$\approx$4 pF, $V_o$=0.95 Volts, $V_{REF}$=1.4 Volts, and $V_{cc}$=2.5 Volts.

Figure 5:
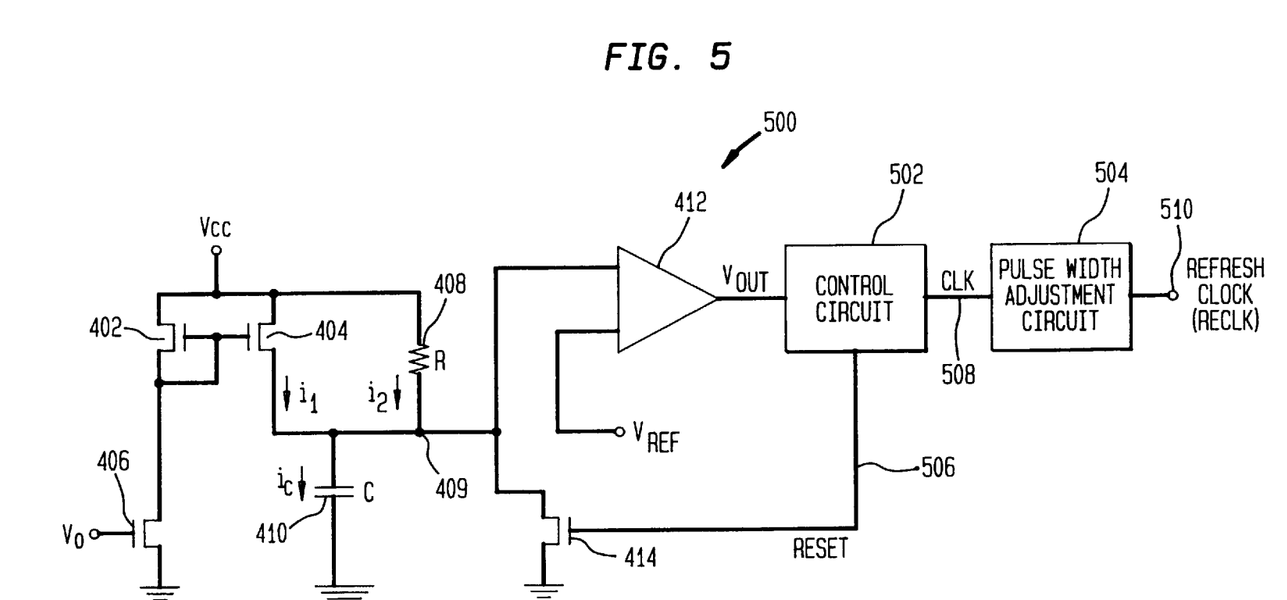
FIG. 5 is a schematic diagram of an oscillator circuit according to a second embodiment of the invention.

FIG. 5 is a schematic diagram of an oscillator circuit 500 according to another embodiment of the invention. The oscillator circuit 500 is similar to the oscillator circuit 400 illustrated in FIG. 4. In addition to including all the components of the oscillator circuit 400, the oscillator circuit 500 includes a control circuit 502 and a pulse width adjustment circuit 504. The control circuit 502 produces a reset signal 506 that is used to activate the reset transistor 414. When the reset transistor 414 is activated, the capacitor (C) 410 is discharged. The reset signal 506 contains an activation pulse that activates the reset transistor 414. The duration of the activation pulse of the reset signal 506 is sufficient to completely discharge the capacitor (C) 410. The control circuit 502 also outputs a clock signal 508 to the pulse width adjustment circuit 504. In one embodiment, the clock signal 508 is a delayed version of the pulses produced by the differential amplifier 412. The pulse width adjustment circuit 504 receives the clock signal 508 and adjusts the pulse width of the pulses to produce a refresh clock (RFCLK) with a suitable period and duty cycle. As an example, a suitable refresh clock (RFCLK) for a DRAM integrated circuit might have a period of 980 ns, of which 12 ns is a high logic level and 968 ns is a low logic level.

Figure 6:
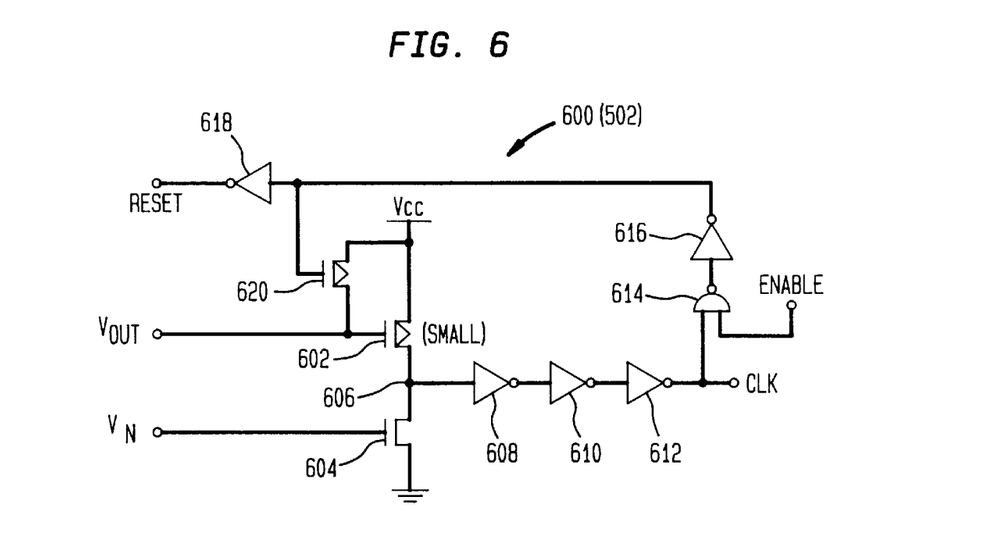
FIG. 6 is a schematic diagram of a control circuit according to an embodiment of the invention.

FIG. 6 is a schematic diagram of a control circuit 600 according to an embodiment of the invention. The control circuit 600 represents a detailed implementation of one embodiment of the control circuit 502 illustrated in FIG. 5. The control circuit 600 includes a first FET 602 and a second FET 604 coupled between the first supply potential ($V_{cc}$) and the second supply potential (ground). The drain of the first FET 602 connects to the drain of the second FET 604 at a node 606. The source of the first FET 602 is connected to the first supply potential ($V_{cc}$), and the source of the second FET 604 is connected to the second supply potential (ground). The gate of the first FET 602 receives a voltage ($V_{OUT}$) supplied by the differential amplifier 412. The gate of the second FET 604 receives a voltage ($V_N$) that controls the current flow through the second FET 604. The node 606 is coupled to a first inverter 608. The first inverter 608 is coupled to a second inverter 610. The second inverter 610 is coupled to a third inverter 612. The output of the third inverter 612 is the clock signal 508. The output of the third inverter 612 is also supplied to an input of a NAND gate 614. The other input terminal of the NAND gate 614 receives an enable signal for the oscillator circuit. The output of the NAND gate 614 is supplied to a fourth inverter 616. The output of the fourth inverter 616 is supplied to an inverter 618 which outputs the reset signal 506. The output of the fourth inverter 616 is also supplied to a gate of a third FET 620. The source of the third FET 620 is coupled to the first supply potential ($V_{cc}$) and the drain of the third FET 620 is connected to the gate of the first FET 602.

The operation of the control circuit 600 is described as follows. The voltage ($V_N$) is normally set to a positive value greater than the second supply potential (ground) and less or equal to the first supply potential ($V_{cc}$). For example, the voltage ($V_N$) might be 0.95 Volts. The voltage ($V_{OUT}$) supplied by the differential amplifier 412 transitions to a low logic level when the beginning of a pulse is received (i.e., when $V_c < V_{REF}$). When the voltage ($V_{OUT}$) is in the low logic level, the first FET 602 is "ON" and the node 606 is pulled towards the first supply potential ($V_{cc}$). The clock signal 508 output by the third inverter 612 goes to the low logic level after the gate delays of the inverters 608–612. Assuming that the control circuit 600 is enabled, the output of the NAND gate 614 thereafter goes to a high logic level and the output of the inverter 616 goes to a low logic level. The reset signal 506 then in turn goes to a high logic level and activates the reset transistor 414 to discharge the capacitor (C) 410. Further, the output of the inverter 616 is also supplied to a gate terminal of the third FET 620. When the gate terminal of the third FET 620 is at a low logic level, the voltage ($V_{OUT}$) is pulled up to the first supply potential ($V_{cc}$) which causes the first FET 602 to turn "OFF" which then causes the node 606 to be pulled down slowly towards the second supply potential (ground). As this happens, the clock signal 508 is pulled to a high level, thus ending the pulse. Thereafter, the cycle repeats again for the next pulse.

Figure 7:
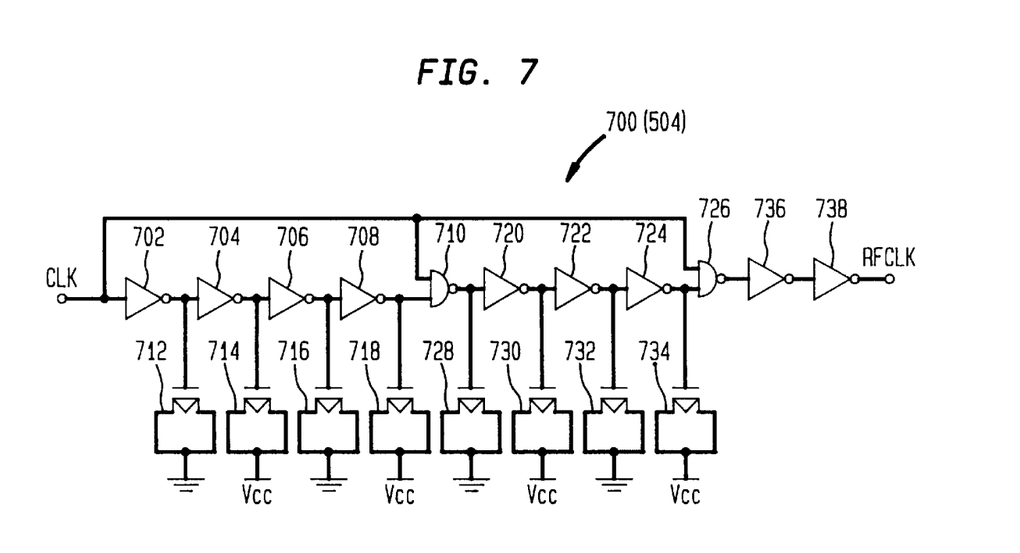
FIG. 7 is a schematic diagram of a pulse width adjustment circuit according to an embodiment of the invention.

FIG. 7 is a schematic diagram of a pulse width adjustment circuit 700 according to an embodiment of the invention. The pulse width adjustment circuit 700 represents a detailed implementation of one embodiment of the pulse width adjustment circuit 504 illustrated in FIG. 5.

The pulse width adjustment circuit 700 implements a delay chain with a first part and a second part. The pulse width adjustment circuit 700 receives the clock signal 508 from the control circuit 502 and outputs the refresh clock (RFCLK) 510. The clock signal 508 is supplied to the first part and then to the second part. The first part includes a sequence of inverters 702-708, and then a NAND gate 710. The output of the NAND gate 710 is supplied to the second part. The second part includes another series of inverters 720–724, and then a NAND gate 726. The output of a NAND gate 726 is supplied to inverter 736 whose output is in turn supplied to an inverter 738. The output of the inverter 738 is the refresh clock (RFCLK) 510. The outputs of the inverters 702, 706, 722 and the NAND gate 710 each have a capacitive load placed between their output and the second supply potential (ground) to provide an appropriate delay. The capacitive loads are implemented by n-type FET transistors 712, 716, 732 and 728, respectively. The transistors 712, 716, 728 and 732 have their drains and sources coupled to the second supply potential (ground) and have their gates coupled to the respective outputs of the inverters 702, 706, 722 and the NAND gate 710. Similarly, the outputs of the inverters 704, 708, 720 and 724 are also each connected to a capacitive load. The capacitive loads are provided by p-type FET transistors 714, 718, 730 and 734, respectively. The transistors 714, 718, 730 and 734 have their drain and source coupled to the first supply potential ($V_{cc}$) and have their gates coupled to the respective outputs of the inverters 704, 708, 720 and 724. In effect, the pulse width adjustment circuit 700 stretches the duration of the pulse (i.e., high logic level) of the clock signal 508 in producing the refresh clock (RFCLK) 510.

The period or frequency of the refresh clock (RFCLK) varies with application. Many DRAM integrated circuits use a refresh clock having a period in a range of 900–1000 ns, with an active pulse duration (e.g., pulse width) of approximately 10–14 ns. In one example, the active pulse duration could be approximately 12 ns from an input pulse (clock signal 508) of approximately 4–5 ns. Also, in one example, the period for the resulting refresh clock (RFCLK) 510 could be 980 ns which is suitable for several existing DRAM integrated circuits.

In an integrated circuit design, resistance is normally provided by diffusion regions within the integrated circuit, capacitance is provided by a series of small capacitances connected in parallel by field effect transistors (FETs) within the integrated circuit having their drains and sources connected. The transistors with the oscillator circuits are preferably FETs.

It should also be recognized that a portion of the capacitance represented by the capacitor (C) 410 may be provided by the resistor (R) 408 and the differential amplifier 412 that coupled to the node 409. The remaining portion of the capacitance is realized by FET transistors, e.g., p-type FET depletion type capacitors. The oscillator circuit may further include several options to adjust the oscillator frequency to modify the capacitance. The options can be selected by fuses. The oscillator circuit could also include an option to select current driving from only one of the current sources providing currents ($i_1$) or ($i_2$).

It should also be recognized that the resistance (R) 408 may be provided by diffusion regions within the integrated circuit. The oscillator circuit can also provide for several options to adjust the resistance value.

The oscillator circuits according to the invention could also allow the frequency of the pulses (or clock) produced to be varied or adjusted. For example, by manufacturing an integrated circuit that implements the invention to include programmable fuses, the oscillator circuits are able to trim or adjust the frequency by adding or removing capacitance, by adding or removing resistance, and/or by otherwise adding or removing current drive capability.

Figure 8A:
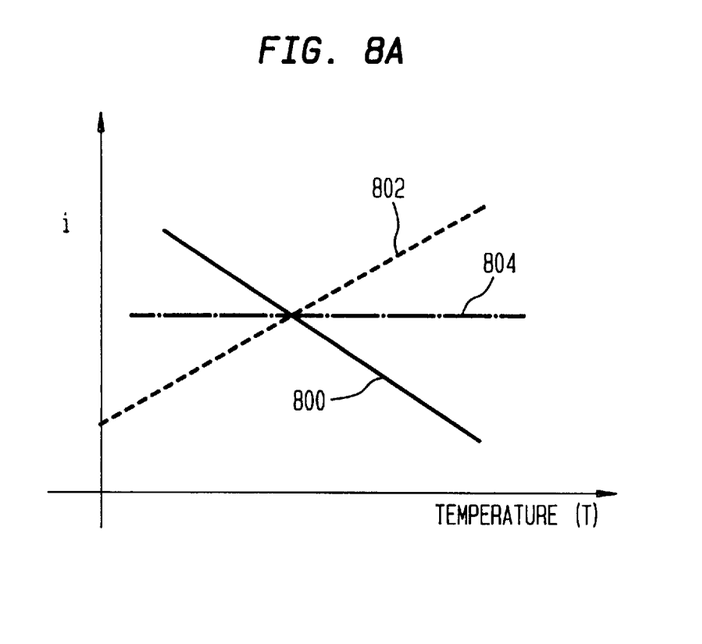
FIG. 8A is a diagram of current (i) verses temperature (T)

FIG. 8A is a diagram of current (i) verses temperature (T). The diagram in FIG. 8A provides a comparison of the first conventional oscillator 100 and the second conventional oscillator 200 with an oscillator according to the invention such as the oscillator circuit 400 illustrated in FIG. 4. The current (i) versus temperature (T) characteristics of the first conventional oscillator 100 is represented by line 800. The current (i) versus temperature (T) characteristics of the second conventional oscillator 200 is indicated by the line 802. Note that the current (i) verses temperature (T) characteristics of the first and second conventional circuits 100, 200 vary with temperature and move in opposite directions as temperature changes. The current (i) versus temperature (T) characteristics for the invention are indicated by line 804. Note that the line 804 is constant over temperature, thus indicating that the current (i) is constant over temperature (T).

Figure 8B:
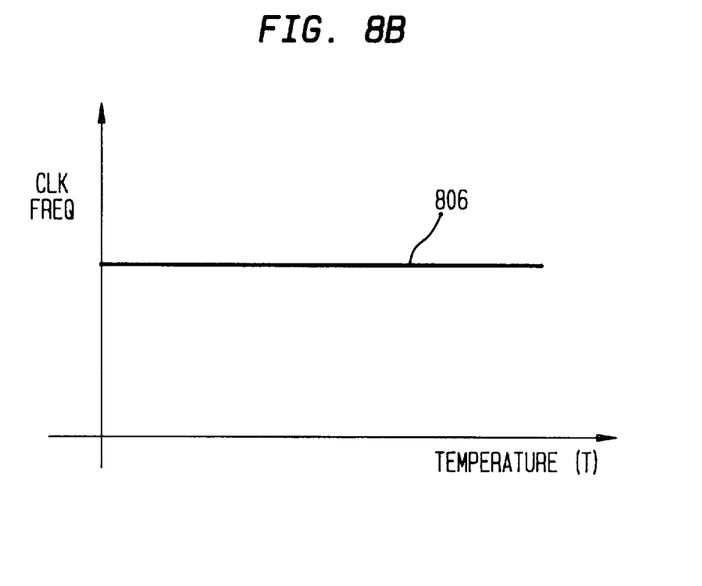
FIG. 8B is a diagram of clock frequency verses temperature (T) according to the invention.

FIG. 8B is a diagram of clock frequency verses temperature (T) according to the invention. As illustrated in FIG. 8B, line 806 indicates that the clock frequency is essentially constant over temperature. The constant nature of the clock frequency (and the current (i)) provided by the oscillators according to the invention provided for more stable clock signals over a wide temperature range. This constant nature applies at least over an operational temperature range associated with the circuitry such as between 0_C. and 85_C.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An oscillator for an integrated circuit device, comprising:
    a current source for supplying a current, the current source including a first current source with a current path coupled between a supply voltage node and a charge accumulation node, the first current source for supplying a first current that increases as temperature increases, the current source further including a second current source with a current path coupled between the supply voltage node and the charge accumulation node, the second current source for supplying a second current that decreases as temperature increases;
    a charge accumulation device coupled to said current source at the charge accumulation node, wherein said charge accumulation device operates to accumulate charge from the current supplied by said current source, and to output a voltage in accordance with the amount of the accumulated charge;
    a pulse generation circuit coupled to said charge accumulation device, wherein said pulse generation circuit outputs a clock pulse after the voltage output from said charge accumulation device exceeds a predetermined threshold; and
    a reset circuit coupled to said pulse generation circuit, wherein said reset circuit operates to reset said charge accumulation device so that charge thereafter begins to accumulate for a next clock pulse.

2. An oscillator as recited in claim 1, wherein said current source further comprises:
    a combiner for combining the first current and the second current to produce the current being supplied by said current source such that the current is independent of temperature over a normal operating range of the integrated circuit device.

3. An oscillator as recited in claim 1,
    wherein said first current source comprises a current mirror formed from a pair of transistors, and
    wherein said second current source comprises a resistive element.

4. An oscillator as recited in claim 2, wherein said combiner comprises a summing node where the first current and the second current are summed together to produce the current supplied to said charge accumulation device.

5. An oscillator as recited in claim 1, wherein said oscillator is a low frequency oscillator.

6. A low frequency oscillator, comprising:
    a first FET transistor having gate, drain and source terminals, wherein the source terminal is connected to a first supply potential, and the gate terminal and the drain terminal are commonly connected;
    a second FET transistor having gate, drain and source terminals, wherein the source terminal is connected to the first supply potential, and the gate terminal is connected to the gate terminal of said first FET transistor;
    a third FET transistor having gate, drain and source terminals, wherein the drain terminal is connected to the drain terminal of said first FET transistor, the source terminal is connected to a second supply potential, and the gate terminal receives a third supply potential, the third supply potential having a voltage between that of said first and second supply potentials;
    a capacitive load coupled between the drain terminal of said second FET transistor and the second supply potential, said capacitive load coupling to the drain terminal of said second FET transistor at a node;
    a resistive device for providing a resistance, said resistive device having a first side coupled to the first supply potential and having a second side coupled to said capacitive load at the node;
    a fourth FET transistor having gate, drain and source terminals, wherein the drain terminal is connected to the node, the source terminal is connected to the second supply potential, and the gate terminal receives a reset signal; and
    a differential amplifier having a first input terminal, a second input terminal and an output terminal, wherein the first input terminal is connected to the node, the second input terminal is connected to a reference voltage, and the output terminal produces an output signal.

7. A low frequency oscillator as recited in claim 6, wherein said resistive device comprises a diffusion region, and wherein said capacitive load comprises at least one FET transistor.

8. A low frequency oscillator as recited in claim 6, wherein said low frequency oscillator further comprises:
    a reset pulse generator for producing the reset signal from the output signal; and
    an output pulse generator for producing an output clock signal from the output signal, the output clock signal having a predetermined period.

9. A low frequency oscillator as recited in claim 8, wherein the period of the output clock signal has a period in a range of 900–1000 ms, with an active pulse duration of approximately 10–14 ns.

10. A low frequency oscillator as recited in claim 6, wherein said low frequency oscillator is formed in an integrated circuit.

11. A low frequency oscillator as recited in claim 10, wherein the integrated circuit includes a DRAM.

12. A low frequency oscillator as recited in claim 6, wherein the first supply voltage is $V_{cc}$, and the second supply voltage is ground, and
wherein said first and second FET transistors are p-type FET transistors, and said third and fourth FET transistors are n-type FET transistors.

13. A self-refreshing dynamic random access memory, comprising:
an array of dynamic random access memory cells for storing data; and
a self-refresh circuit operatively connected to said array, wherein said self-refresh circuit operates to periodically refresh the data stored in said array, said self-refresh circuit including at least a temperature independent frequency oscillator that produces a refresh clock having a substantially constant frequency despite temperature variations using first and second temperature dependent currents coupled in parallel, the first temperature dependent current increasing as temperature increases and the second temperature dependent current decreasing as temperature increases.

14. A self-refreshing dynamic random access memory as recited in claim 13, wherein said self-refresh circuit comprises:
a first temperature dependent current source for producing the first temperature dependent current;
a second temperature dependent current source for supplying the second temperature dependent current,
a charge accumulation device coupled to said first and second temperature independent current sources, said charge accumulation device operates to accumulate charge from the first and second temperature dependent currents supplied by said first and second temperature dependent current sources, and to output a voltage in accordance with the amount of the accumulated charge;
a pulse generation circuit coupled to said charge accumulation device, said pulse generation circuit outputs a clock pulse after the voltage output from said charge accumulation device exceeds a predetermined threshold; and
a reset circuit coupled to said pulse generation circuit, said reset circuit operates to reset said charge accumulation device so that charge thereafter beings to accumulate for a next clock pulse.

15. A self-refreshing dynamic random access memory as recited in claim 14,
wherein said self-refresh circuit further comprises a combiner for combining the first temperature dependent current and the second temperature dependent current to produce a current that is independent of temperature over the normal operating range of the dynamic random access memory.

16. A self-refreshing dynamic random access memory as recited in claim 13,
wherein said first temperature dependent current is supplied by a current mirror formed from a pair of transistors, and
wherein said second temperature dependent current is supplied by a resistive element.

17. A self-refreshing dynamic random access memory as recited in claim 15, wherein said combiner comprises a summing node where the first temperature dependent current and the second temperature dependent current are summed together.

18. A self-refreshing dynamic random access memory as recited in claim 13, wherein said self-refresh circuit comprises:
a first FET transistor having gate, drain and source terminals, wherein the source terminal is connected to a first supply potential, and the gate terminal and the drain terminal are commonly connected;
a second FET transistor having gate, drain and source terminals, wherein the source terminal is connected to the first supply potential, and the gate terminal is connected to the gate terminal of said first FET transistor;
a third FET transistor having gate, drain and source terminals, wherein the drain terminal is connected to the drain terminal of said first FET transistor, the source terminal is connected to a second supply potential, and the gate terminal receives a third supply potential, the third supply potential having a voltage between that of said first and second supply potentials;
a capacitive load coupled between the drain terminal of said second FET transistor and the second supply potential, said capacitive load coupling to the drain terminal of said second FET transistor at a node;
a resistive device for providing a resistance, said resistive device having a first side coupled to the first supply potential and having a second side coupled to said capacitive load at the node;
a fourth FET transistor having gate, drain and source terminals, wherein the drain terminal is connected to the node, the source terminal is connected to the second supply potential, and the gate terminal receives a reset signal; and
a differential amplifier having a first input terminal, a second input terminal and an output terminal, wherein the first input terminal is connected to the node, the second input terminal is connected to a reference voltage, and the output terminal produces an output signal.

19. A self-refreshing dynamic random access memory as recited in claim 18, wherein said resistive device comprises at least one diffusion region.

20. A self-refreshing dynamic random access memory as recited in claim 18, wherein said self-refresh circuit further comprises:
a reset pulse generator for producing the reset signal from the output signal; and
an output pulse generator for producing an output clock signal from the output signal, the output clock having a predetermined period.

21. An oscillator as recited in claim 1 wherein the current supplied by the current source is substantially independent of temperature of a normal range of the integrated circuit device.

22. A method of generating a clock signal, the method comprising:
generating a first current that increases as temperature increases, the first current flowing from a first node to a second node;
generating a second current that decreases as temperature increases, the second current flowing from a first node to a second node;
accumulating charge from the first current and the second current at the second node;

sensing when the charge accumulated at the second node exceeds a selected threshold level;

generating a clock pulse when the charge accumulated at the second node exceeds the selected threshold level;

depleting the charge at the second node when the charge accumulated at the second node exceeds the selected threshold level; and repeating the accumulating, sensing, generating and depleting steps.

23. The method of claim 22 wherein the rate at which charge accumulates at the second node is substantially independent of temperature.

* * * * *